US011127587B2

(12) United States Patent
Liu et al.

(10) Patent No.: US 11,127,587 B2
(45) Date of Patent: *Sep. 21, 2021

(54) NON-AMINE POST-CMP COMPOSITIONS AND METHOD OF USE

(71) Applicant: ENTEGRIS, INC., Billerica, MA (US)

(72) Inventors: Jun Liu, Brookfield, CT (US); Elizabeth Thomas, Danbury, CT (US); Donald Frye, Sherman, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/116,372

(22) PCT Filed: Feb. 3, 2015

(86) PCT No.: PCT/US2015/014203
§ 371 (c)(1),
(2) Date: Aug. 3, 2016

(87) PCT Pub. No.: WO2015/119925
PCT Pub. Date: Aug. 13, 2015

(65) Prior Publication Data
US 2016/0351388 A1 Dec. 1, 2016

Related U.S. Application Data

(60) Provisional application No. 61/955,278, filed on Mar. 19, 2014, provisional application No. 61/936,065, filed on Feb. 5, 2014.

(51) Int. Cl.
| | | |
|---|---|---|
| H01L 21/02 | (2006.01) |
| C11D 7/06 | (2006.01) |
| C11D 7/16 | (2006.01) |
| C11D 7/26 | (2006.01) |
| C11D 7/32 | (2006.01) |
| C11D 11/00 | (2006.01) |
| C11D 7/36 | (2006.01) |
| C11D 7/12 | (2006.01) |
| C11D 7/04 | (2006.01) |
| C11D 7/10 | (2006.01) |
| C11D 7/34 | (2006.01) |

(52) U.S. Cl.
CPC .......... *H01L 21/02074* (2013.01); *C11D 7/04* (2013.01); *C11D 7/06* (2013.01); *C11D 7/10* (2013.01); *C11D 7/12* (2013.01); *C11D 7/16* (2013.01); *C11D 7/261* (2013.01); *C11D 7/265* (2013.01); *C11D 7/267* (2013.01); *C11D 7/3245* (2013.01); *C11D 7/34* (2013.01); *C11D 7/36* (2013.01); *C11D 11/0047* (2013.01)

(58) Field of Classification Search
USPC ....................................................... 510/175
See application file for complete search history.

(56) References Cited

U.S. PATENT DOCUMENTS

| | | |
|---|---|---|
| 5,320,709 A | 6/1994 | Bowden |
| 5,702,075 A | 12/1997 | Lehrman |
| 5,976,928 A | 11/1999 | Kirlin et al. |
| 5,993,685 A | 11/1999 | Currie et al. |
| 6,194,366 B1 | 2/2001 | Naghshineh et al. |
| 6,211,126 B1 | 4/2001 | Wojtczak et al. |
| 6,224,785 B1 | 5/2001 | Wojtczak et al. |
| 6,280,651 B1 | 8/2001 | Wojtczak et al. |
| 6,306,807 B1 | 10/2001 | Wojtczak et al. |
| 6,322,600 B1 | 11/2001 | Brewer et al. |
| 6,323,168 B1 | 11/2001 | Kloffenstein et al. |
| 6,344,432 B1 | 2/2002 | Wojtczak et al. |
| 6,346,741 B1 | 2/2002 | Van Buskirk et al. |
| 6,350,727 B1 | 2/2002 | Flower |
| 6,395,194 B1 | 5/2002 | Russell et al. |
| 6,409,781 B1 | 6/2002 | Wojtczak et al. |
| 6,492,308 B1 | 12/2002 | Naghshineh et al. |
| 6,527,819 B2 | 3/2003 | Wojtczak et al. |
| 6,566,315 B2 | 5/2003 | Wojtczak et al. |
| 6,627,587 B2 | 9/2003 | Naghshineh et al. |
| 6,723,691 B2 | 4/2004 | Naghshineh et al. |
| 6,735,978 B1 | 5/2004 | Tom et al. |
| 6,755,989 B2 | 6/2004 | Wojtczak et al. |
| 6,773,873 B2 | 8/2004 | Seijo et al. |
| 6,800,218 B2 | 10/2004 | Ma et al. |
| 6,802,983 B2 | 10/2004 | Mullee et al. |
| 6,849,200 B2 | 2/2005 | Baum et al. |
| 6,875,733 B1 | 4/2005 | Wojtczak |

(Continued)

FOREIGN PATENT DOCUMENTS

| | | |
|---|---|---|
| JP | 2009069505 A | 4/2009 |
| JP | 2011159658 A | 8/2011 |
| JP | 2012021151 A | 2/2012 |
| JP | 2012062572 A | 3/2012 |
| JP | 2012186470 A | 9/2012 |
| JP | 2012251026 A | 12/2012 |
| TW | 200628575 | 8/2006 |
| TW | 200908148 | 2/2009 |
| WO | 2006110645 A2 | 10/2006 |

(Continued)

OTHER PUBLICATIONS

International Search Report/Written Opinion, dated May 22, 2015.

*Primary Examiner* — Mikhail Kornakov
*Assistant Examiner* — Ryan L Coleman
(74) *Attorney, Agent, or Firm* — Entegris, Inc.

(57) ABSTRACT

An amine-free composition and process for cleaning post-chemical mechanical polishing (CMP) residue and contaminants from a microelectronic device having said residue and contaminants thereon. The compositions achieve highly efficacious cleaning of the post-CMP residue and contaminant material from the surface of the microelectronic device without compromising the low-k dielectric material, copper interconnect material, or cobalt-containing materials.

17 Claims, No Drawings

(56) References Cited

U.S. PATENT DOCUMENTS

| | | | |
|---|---|---|---|
| 6,896,826 B2 | 5/2005 | Wojtczak et al. |
| 6,943,139 B2 | 9/2005 | Korzenski et al. |
| 6,989,358 B2 | 1/2006 | Korzenski et al. |
| 7,011,716 B2 | 3/2006 | Xu et al. |
| 7,029,373 B2 | 4/2006 | Ma et al. |
| 7,030,168 B2 | 4/2006 | Xu et al. |
| 7,119,052 B2 | 10/2006 | Korzenski et al. |
| 7,119,418 B2 | 10/2006 | Xu et al. |
| 7,160,815 B2 | 1/2007 | Korzenski et al. |
| 7,223,352 B2 | 5/2007 | Korzenski et al. |
| 7,300,601 B2 | 11/2007 | Liu et al. |
| 7,326,673 B2 | 2/2008 | Xu et al. |
| 7,335,239 B2 | 2/2008 | Baum |
| 7,361,603 B2 | 4/2008 | Liu et al. |
| 7,365,045 B2 | 4/2008 | Walker et al. |
| 7,387,964 B2 | 6/2008 | So et al. |
| 7,485,611 B2 | 2/2009 | Roeder et al. |
| 7,534,752 B2 | 5/2009 | Wojtczak et al. |
| 7,537,709 B2 | 5/2009 | Cooper et al. |
| 7,553,803 B2 | 6/2009 | Korzenski et al. |
| 7,557,073 B2 | 7/2009 | Korzenski et al. |
| 7,736,405 B2 | 6/2010 | Darsillo et al. |
| 7,846,265 B1 | 12/2010 | Badesha et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 7,976,723 B2 | 7/2011 | Rath et al. |
| 7,977,292 B2 | 7/2011 | Matsunaga et al. |
| 8,026,200 B2 | 9/2011 | Cooper et al. |
| 8,058,219 B2 | 11/2011 | Rath et al. |
| 8,092,707 B2 | 1/2012 | Hardy et al. |
| 8,114,220 B2 | 2/2012 | Visintin et al. |
| 8,178,585 B2 | 5/2012 | Petruska et al. |
| 8,236,485 B2 | 8/2012 | Minsek et al. |
| 8,304,344 B2 | 11/2012 | Boggs et al. |
| 8,338,087 B2 | 12/2012 | Rath et al. |
| 8,367,555 B2 | 2/2013 | Afzali-Ardakani et al. |
| 8,618,036 B2 | 12/2013 | Afzali-Ardakani et al. |
| 8,685,909 B2 | 4/2014 | Angst et al. |
| 8,754,021 B2 | 6/2014 | Barnes et al. |
| 8,778,210 B2 | 7/2014 | Cooper et al. |
| 8,951,948 B2 | 2/2015 | Rath et al. |
| 9,045,717 B2 | 6/2015 | Nakanishi et al. |
| 9,063,431 B2 | 6/2015 | Barnes et al. |
| 9,074,169 B2 | 7/2015 | Chen et al. |
| 9,074,170 B2 | 7/2015 | Barnes et al. |
| 9,175,404 B2 | 11/2015 | Kojima et al. |
| 9,215,813 B2 | 12/2015 | Brosseau et al. |
| 9,221,114 B2 | 12/2015 | Chen et al. |
| 9,238,850 B2 | 1/2016 | Korzenski et al. |
| 9,416,338 B2 | 8/2016 | Cooper et al. |
| 9,520,617 B2 | 12/2016 | Cooper |
| 2002/0077259 A1* | 6/2002 | Skee .................. C11D 11/0047 510/175 |
| 2003/0134512 A1* | 7/2003 | Miller ................ H01L 21/3212 438/692 |
| 2004/0229461 A1* | 11/2004 | Darsillo .................. C09G 1/02 438/689 |
| 2005/0118832 A1 | 6/2005 | Korzenski et al. |
| 2005/0145311 A1 | 7/2005 | Walker et al. |
| 2005/0227482 A1 | 10/2005 | Korzenski et al. |
| 2005/0236601 A1* | 10/2005 | Liu .......................... C09G 1/02 252/79.1 |
| 2005/0239673 A1 | 10/2005 | Hsu |
| 2005/0263490 A1 | 12/2005 | Liu et al. |
| 2006/0019850 A1 | 1/2006 | Korzenski et al. |
| 2006/0063687 A1 | 3/2006 | Minsek et al. |
| 2006/0148666 A1 | 7/2006 | Peters et al. |
| 2006/0154186 A1 | 7/2006 | Minsek et al. |
| 2006/0249482 A1 | 11/2006 | Wrschka et al. |
| 2007/0251551 A1 | 11/2007 | Korzenski et al. |
| 2008/0076688 A1 | 3/2008 | Barnes et al. |
| 2008/0125342 A1 | 5/2008 | Visintin et al. |
| 2008/0271991 A1 | 11/2008 | Korzenski et al. |
| 2009/0008600 A1* | 1/2009 | Jia ......................... B23H 5/08 252/79.1 |
| 2009/0032766 A1 | 2/2009 | Rajaratnam et al. |
| 2009/0192065 A1 | 7/2009 | Korzenski et al. |
| 2009/0212021 A1 | 8/2009 | Bernhard et al. |
| 2009/0215269 A1 | 8/2009 | Boggs et al. |
| 2009/0253072 A1 | 10/2009 | Petruska et al. |
| 2009/0301996 A1 | 12/2009 | Visintin et al. |
| 2010/0056410 A1 | 3/2010 | Visintin et al. |
| 2010/0065530 A1 | 3/2010 | Walker et al. |
| 2010/0087065 A1 | 4/2010 | Boggs et al. |
| 2010/0112728 A1* | 5/2010 | Korzenski ......... H01L 21/02079 438/3 |
| 2010/0163788 A1 | 7/2010 | Visintin et al. |
| 2010/0261632 A1* | 10/2010 | Korzenski ............... C11D 7/265 510/175 |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2013/0035275 A1* | 2/2013 | Silvernail ............... C11D 3/044 510/470 |
| 2013/0045597 A1 | 2/2013 | Kamada et al. |
| 2013/0045908 A1 | 2/2013 | Cui |
| 2013/0143785 A1 | 6/2013 | Taniguchi et al. |
| 2013/0157472 A1 | 6/2013 | Cui |
| 2013/0270217 A1 | 10/2013 | Yoshida et al. |
| 2013/0280123 A1 | 10/2013 | Chen et al. |
| 2013/0295712 A1 | 11/2013 | Chen et al. |
| 2014/0038420 A1 | 2/2014 | Chen et al. |
| 2014/0306162 A1 | 10/2014 | Poe et al. |
| 2014/0318584 A1 | 10/2014 | Cooper et al. |
| 2015/0027978 A1 | 1/2015 | Barnes et al. |
| 2015/0045277 A1 | 2/2015 | Liu et al. |
| 2015/0050199 A1 | 2/2015 | Korzenski et al. |
| 2015/0075570 A1 | 3/2015 | Wu et al. |
| 2015/0114429 A1 | 4/2015 | Jenq et al. |
| 2015/0162213 A1 | 6/2015 | Chen et al. |
| 2015/0168843 A1 | 6/2015 | Cooper et al. |
| 2015/0344825 A1 | 12/2015 | Cooper et al. |
| 2016/0020087 A1 | 1/2016 | Liu et al. |
| 2016/0032186 A1 | 2/2016 | Chen et al. |
| 2016/0075971 A1 | 3/2016 | Liu et al. |
| 2016/0122696 A1 | 5/2016 | Liu et al. |
| 2016/0130500 A1 | 5/2016 | Chen et al. |
| 2016/0185595 A1 | 6/2016 | Chen et al. |
| 2016/0200975 A1 | 7/2016 | Cooper et al. |
| 2016/0314990 A1 | 10/2016 | Bilodeau et al. |
| 2016/0322232 A1 | 11/2016 | Bilodeau et al. |
| 2016/0340620 A1 | 11/2016 | Sun et al. |
| 2016/0343576 A1 | 11/2016 | Bilodeau et al. |
| 2016/0351388 A1 | 12/2016 | Liu et al. |

FOREIGN PATENT DOCUMENTS

| | | |
|---|---|---|
| WO | 2006127885 A1 | 11/2006 |
| WO | 2007027522 A2 | 3/2007 |
| WO | 2008036823 A2 | 3/2008 |
| WO | 2008157345 A2 | 12/2008 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012154498 A2 | 11/2012 |
| WO | 2012174518 A2 | 12/2012 |
| WO | 2013058770 A1 | 4/2013 |
| WO | 2013123317 A1 | 8/2013 |
| WO | 2013138278 A1 | 9/2013 |
| WO | 2015116679 A1 | 8/2015 |

* cited by examiner

NON-AMINE POST-CMP COMPOSITIONS AND METHOD OF USE

CROSS-REFERENCE TO RELATED APPLICATIONS

This application is filed under the provisions of 35 U.S.C. § 371 and claims the priority of International Patent Application No. PCT/US2015/014203 filed on 3 Feb. 2015 entitled "NON- AMINE POST-CMP COMPOSITIONS AND METHOD OF USE" in the name of Jun LIU, et al., which claims priority to U.S. Provisional Patent Application No. 61/955,278 filed on 19 Mar. 2014, and U.S. Provisional Patent Application No. 61/936,065 filed on 5 Feb. 2014, all of which are hereby incorporated by reference herein in their entirety.

FIELD OF THE INVENTION

The present invention relates to amine-free compositions for substantially and efficiently cleaning residue and/or contaminants from microelectronic devices having same thereon.

DESCRIPTION OF THE RELATED ART

It is well known that integrated circuit (IC) manufacturers have replaced aluminum and aluminum alloys with copper for advanced microelectronic applications because copper has a higher conductivity that translates to significant improvement in the interconnect performance. In addition, copper-based interconnects offer better electromigration resistance than aluminum, thereby improving the interconnect reliability. That said, the implementation of copper faces certain challenges. For example, the adhesion of copper (Cu) to silicon dioxide ($SiO_2$) and to other dielectric materials is generally poor. Poor adhesion results in the delamination of Cu from adjoining films during the manufacturing process. Also, Cu ions readily diffuse into $SiO_2$ under electrical bias, and increase the dielectric electrical leakage between Cu lines even at very low Cu concentrations within the dielectric. In addition, if copper diffuses into the underlying silicon where the active devices are located, device performance can be degraded.

The problem of the high diffusivity of copper in silicon dioxide ($SiO_2$), and in other inter-metal dielectrics (IMDs)/interlevel dielectrics (ILDs), remains of great concern. To deal with this issue, an integrated circuit substrate must be coated with a suitable barrier layer that encapsulates copper and blocks diffusion of copper atoms. The barrier layer, comprising both conductive and non-conductive materials, is typically formed over a patterned dielectric layer and prior to deposition of copper. Typical materials for the barrier layer include tantalum (Ta), tantalum nitride ($TaN_x$), tungsten (W), titanium (Ti), titanium nitride (TiN), ruthenium (Ru), cobalt (Co), molybdenum (Mo), rhenium (Rh), and alloys thereof.

In the manufacturing of deep submicron semiconductors, the copper damascene process is used to form conductive copper lines and vias in the low-k dielectric layer. One important step of the damascene process is copper chemical mechanical polishing (CMP) for the removal of excess copper above the dielectric layer surface. The CMP process involves holding and rotating a thin, flat substrate of the semiconductor device against a wetted polishing pad under controlled pressure and temperature in the presence of CMP slurries. The slurries contain abrasive materials and chemical additives as appropriate to the specific CMP process and requirements. Following the CMP process, contaminants consisting of particles from the polishing slurry, chemicals added to the slurry, and reaction by-products of the polishing slurry are left behind on the wafer surface. All contaminants must be removed prior to any further steps in the microelectronic device fabrication process to avoid degradation of device reliability and introduction of defects into the device. Often, particles of these contaminants are smaller than 0.3 µm.

One particular issue in this respect is the residues that are left on the microelectronic device substrate following CMP processing. Such residues include CMP material and corrosion inhibitor compounds such as benzotriazole (BTA). If not removed, these residues can cause damage to copper lines or severely roughen the copper metallization, as well as cause poor adhesion of post-CMP applied layers on the device substrate. Severe roughening of copper metallization is particularly problematic, since overly rough copper can cause poor electrical performance of the product microelectronic device. Towards that end, post-CMP removal compositions have been developed to remove the post-CMP residue and contaminants.

Conventional cleaning techniques use fluid flow of a cleaning solution, e.g., alkaline solutions based on ammonium hydroxide, over the wafer surface in combination with megasonics, jetting or brushing to remove contaminants. Said cleaning solutions remove the contaminants by attacking the wafer surface or reacting with the contaminants before removing the dislodged contaminants from the wafer. Disadvantageously, some of the contaminants may be chemically inert to the chemical ingredients in the cleaning solutions. Furthermore, the amine-containing cleaning solutions known in the art smell and release amine vapors into the fab which can poison photoresist.

It would be a significant advance in the art to provide improved amine-free compositions for post-CMP cleaning of the microelectronic devices, for the substantially defect-free and substantially scratch-free removal of CMP residue and contaminants from the surface of said device. Said aqueous compositions effectuate substantial residue and contaminant removal from the surface of the device without damaging the exposed low-k dielectric material and interconnect and via materials, e.g., copper and/or aluminum containing materials.

SUMMARY OF THE INVENTION

The present invention generally relates to an amine-free composition and process for cleaning residue and/or contaminants from microelectronic devices having said residue and contaminants thereon. The residue may include post-CMP residue.

In one aspect, a composition for cleaning residue and contaminants from a surface is described, said composition comprising at least one complexing agent, at least one basic compound, at least one buffering agent, water, optionally at least one oxidizing agent, optionally at least one reducing agent, and optionally at least one solvating agent, wherein the composition is substantially devoid of amines, quaternary bases, fluoride-containing sources, and abrasive material typically used in chemical mechanical polishing processes.

In another aspect, a method of cleaning residue and contaminants from a microelectronic device having said residue and contaminants thereon is described, said method comprising contacting the microelectronic device with a composition for sufficient time to at least partially clean said residue and contaminants from the microelectronic device, wherein the composition comprises at least one complexing agent, at least one basic compound, at least one buffering agent, water, optionally at least one oxidizing agent, optionally at least one reducing agent, and optionally at least one solvating agent, wherein the composition is substantially devoid of amines, quaternary bases, fluoride-containing sources, and abrasive material typically used in chemical mechanical polishing processes.

Other aspects, features and advantages of the invention will be more fully apparent from the ensuing disclosure and appended claims.

DETAILED DESCRIPTION OF THE INVENTION, AND PREFERRED EMBODIMENTS THEREOF

The present invention relates generally to amine-free compositions that clean post-CMP residue and contaminants from a microelectronic device having said residue and contaminants thereon. The cleaning compositions are compatible with the exposed materials, while substantially removing the post-CMP residue and contaminants from the surface of the microelectronic device.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, e.g., benzotriazole (BTA), reaction by-products of the polishing slurry, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, copper, copper oxides, organic residues, and any other materials that are the by-products of the CMP process.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, carbon-doped oxide (CDO) glass, CORAL™ from Novellus Systems, Inc., BLACK DIAMOND™ from Applied Materials, Inc., SiLK™ from Dow Corning, Inc., and NANOGLASS™ of Nanopore, Inc, and the like. It is to be appreciated that the low-k dielectric materials may have varying densities and varying porosities.

As defined herein, "clean amine-free compositions" correspond to the amine-free compositions just prior to contact with the microelectronic device having post-CMP and/or contaminants thereon.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions of the present invention.

As defined herein, the term "barrier material" corresponds to any material used in the art to seal the metal lines, e.g., copper interconnects, to minimize the diffusion of said metal, e.g., copper, into the dielectric material. Conventional barrier layer materials include tantalum or titanium, their nitrides and silicides, and alloys thereof. Candidate materials that could serve as directly plateable diffusion barriers include ruthenium (Ru), cobalt (Co), tungsten (W), molybdenum (Mo), rhenium (Rh), and alloys thereof including, but not limited to, pure cobalt, CoWP, CoWB, cobalt nitrides (including cobalt nitrides comprising additional elements such as Ta or Li), CoW, CoP, CoSi, and cobalt silicide.

As used herein, "about" is intended to correspond to ±5% of the stated value.

"Substantially devoid" is defined herein as less than 2 wt. %, preferably less than 1 wt. %, more preferably less than 0 5 wt. %, even more preferably less than 0.1 wt. %, and most preferably 0 wt %.

As defined herein, "post-etch residue" corresponds to material remaining following gas-phase plasma etching processes, e.g., BEOL dual damascene processing. The post-etch residue may be organic, organometallic, organosilicic, or inorganic in nature, for example, silicon-containing material, carbon-based organic material, and etch gas residue including, but not limited to, oxygen and fluorine. "Post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

It is understood to the skilled artisan that ammonium hydroxide ($NH_4OH$) can be used interchangeably with ammonia ($NH_3$) when the composition is aqueous.

For the purposes of this invention, an "amine" is defined as at least one primary, secondary, or tertiary amine, with the proviso that (i) an amide group, (ii) species including both a carboxylic acid group and an amine group (e.g., amino acids), (iii) ammonia, (iv) surfactants that include amine groups, and (v) amine-N-oxides are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl, hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen. Quaternary ammonium hydroxide compounds have the general formula $R_1R_2R_3R_4NOH$, where $R_1$, $R_2$, $R_3$ and $R_4$ are the same as or different from one another and are hydrogen, $C_1$-$C_6$ alkyl groups (e.g., methyl, ethyl, propyl, butyl, pentyl or hexyl), and substituted or unsubstituted $C_6$-$C_{10}$ aryl groups (e.g., benzyl); and alkanolamines.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{(\text{Number of } PreClean \text{ Objects} - \text{Number of } PostClean \text{ Objects})}{\text{Number of } PreClean \text{ Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, the present invention relates to an amine-free composition for cleaning post-CMP residue and contaminants, said amine-free composition comprising at least one complexing agent, at least one basic compound, at least one buffering agent, and water. Optionally, the amine-free composition may further comprise at least one oxidizing agent, at least one reducing agent, at least one solvating agent, or a combination thereof. The components in a concentrate of the amine-free composition are present in the following range of weight percents, based on the total weight of the composition,

| Component | weight percent | preferred wt. % |
|---|---|---|
| complexing agent(s) | about 1 wt % to about 30 wt % | about 1 wt % to about 25 wt % |
| basic compound(s) | about 0.01 wt % to about 5 wt % | about 0.01 wt % to about 5 wt % |
| buffering agent(s) | about 0.01 wt % to about 10 wt % | about 0.1 wt % to about 5 wt % |
| water | about 42 wt % to about 99 wt % | about 66.5 wt % to about 95 wt % |
| optional oxidizing agent(s) (when present) | about 0.01 wt % to about 10 wt % | about 0.1 wt % to about 1 wt % |
| optional reducing agent(s) (when present) | about 0.01 wt % to about 10 wt % | about 0.1 wt % to about 5 wt % |
| optional solvating agent(s) (when present) | about 0.01 wt % to about 30 wt % | about 5 wt % to about 20 wt % |

Upon dilution, the weight percent values of the components in the concentrated amine-free composition will change as a factor of the dilution factor, as readily understood by one skilled in the art.

In one embodiment, the amine-free composition comprises, consists of, or consists essentially of at least one complexing agent, at least one basic compound, at least one buffering agent, and water. In another embodiment, the first composition comprises, consists of, or consists essentially of at least one reducing agent, at least one solvating agent, at least one complexing agent, at least one basic compound, at least one buffering agent, and water. In still another embodiment, the amine-free composition comprises, consists of, or consists essentially of at least one solvating agent, at least one complexing agent, at least one basic compound, at least one buffering agent, at least one reducing agent, and water. In yet another embodiment, the amine-free composition comprises, consists of, or consists essentially of at least one oxidizing agent, at least one complexing agent, at least one basic compound, at least one buffering agent, and water. In another embodiment, the amine-free composition comprises, consists of, or consists essentially of at least one oxidizing agent, at least one complexing agent, at least one basic compound, at least one buffering agent, at least one solvating agent, and water. The water is preferably deionized. It should be appreciated that the at least one oxidizing agent, when intended to be present, can be added just upstream of or at the cleaning apparatus.

In the broad practice of the invention, the pH range of the amine-free composition is in a range from about 2.5 to about 13. Depending on the nature of the surface to be cleaned, sometimes a slightly acidic amine-free composition will be preferred, for example in a range from about 2.5 to 7, and other times a slightly basic amine-free composition will be preferred, for example in a range from 7 to about 13.

The compositions described herein may have utility in applications including, but not limited to, post-etch residue removal, post-ash residue removal surface preparation, postplating cleaning, post-CMP residue removal, copper seed etching/cleaning, through silicon via (TSV) cleaning, MEMS cleaning, contaminant removal (e.g., benzotriazole removal), and cobalt and cobalt alloy surface cleaning.

The basic compounds contemplated include alkali metal hydroxides, ammonium hydroxide, and combinations thereof, wherein the alkali metal hydroxides include KOH, CsOH, and combinations thereof. Preferably, the basic compound(s) for the amine-free composition comprise KOH.

The complexing agents contemplated herein include organic acids, comprising at least one COOH group or carboxylate group in a salt thereof, including, but not limited to, lactic acid, maleic acid, ascorbic acid, malic acid, citric acid, benzoic acid, fumaric acid, succinic acid, oxalic acid, malonic acid, mandelic acid, maleic anhydride, phthalic acid, aspartic acid, glutamic acid, glutamic acid, glycolic acid, glyoxylic acid, glycerin, acetylacetone, salicylhydroxamic acid, a salt thereof, or a partially neutralized form thereof, phenylacetic acid, quinic acid, pyromellitic acid, tartaric acid, terephthalic acid, trimellitic acid, trimesic acid, gluconic acid, glyceric acid, formic acid, acetic acid, propionic acid, acrylic acid, adipic acid, itaconic acid, glucuronic acid, glycine, lysine, β-alanine, histidine, phenylalanine, cysteine, leucine, serine, arginine, threonine, asparagine, glutamine, selenocysteine, proline, valine, isoleucine, methionine, tyrosine, tryptophane, 8-hydroxyquinoline, 2,4-pentanedione, benzetetracarboxylic acid, pyruvic acid, tannic acid, sulfanilic acid, 2-hydroxyphosphonocarboxylic acid (HPAA), pyrocatechol, pyrogallol, gallic acid, tannic acid, ethylenediamine tetraacetic acid (EDTA), diethylenetriaminepentaacetic acid (DTPA), (1,2-cyclohexylenedinitrilo)tetraacetic acid (CDTA), iminidiacetic acid, 2-phosphonobutane-1,2,4-tricarboxylic acid (PBTCA), other aliphatic and aromatic carboxylic acids, salts thereof as well as combinations of the foregoing acids. Other complexing agents contemplated, as an alternative or in addition to, include phosphonic acid and derivatives thereof (e.g., hydroxyethylidene diphosphonic acid (HEDP), 1-hydroxyethane-1,1-diphosphonic acid, nitrilo-tris(methylenephosphonic acid, ethylenediamine tetra(methylene phosphonic acid (EDTMP)), salicylic acid, p-toluenesulfonic acid, 5-sulfosalicylic acid and derivatives thereof, and any combination thereof. Preferably, the complexing agent for the amine-free composition comprises 5-sulfosalicylic acid, CDTA, EDTMP, and any combination thereof. Advantageously, some complexing agents serve to stabilize amine-free compositions comprising at least one oxidizing agent. For example, adding just about 0.001 wt % to about 0.1 wt % CDTA or EDTMP to the non-amine composition comprising an oxidizing agent, e.g., urea hydrogen peroxide will stabilize the composition, substantially reducing decomposition of the oxidizing agent over time. Further, as will be discussed later, the inclusion of an amino acid complexing agent, with or without additional complexing agents, serves to enhance the removal of organic contaminants (e.g., benzotriazole from a post-CMP surface).

Buffering agents are added to stabilize the amine-free composition during dilution and manufacturing as well as achieve the appropriate compositional pH, as readily determined by the skilled artisan. Buffering agents contemplated include, but are not limited to, dipotassium phosphate, potassium carbonate, boric acid, lysine, proline, β-alanine, ethylenediamine tetraacetic acid (EDTA), diethylenetriaminepentaacetic acid (DTPA), dimethyl glyoxime, dibasic phosphate salts (e.g., $(NH_4)H_2PO_4$, $K_2HPO_4$), tribasic phosphate salts (e.g., $(NH_4)_3PO_4$, $K_3PO_4$), mixtures of dibasic and tribasic phosphate salts (e.g., $K_2HPO_4/K_3PO_4$), mixures of dibasic and tribasic carbonate salts (e.g., $K_2CO_3/KHCO_3$), hydroxyethylidene diphosphonic acid (HEDP), and combinations thereof. Preferred buffering agents include dibasic phosphate salts (e.g., $(NH_4)H_2PO_4$, $K_2HPO_4$), tribasic phosphate salts (e.g., $(NH_4)_3PO_4$, $K_3PO_4$),mixtures of dibasic and tribasic phosphate salts (e.g., $K_2HPO_4/K_3PO_4$), and combinations thereof.

When present, oxidizing agents contemplated include ozone, nitric acid, bubbled air, cyclohexylaminosulfonic acid, hydrogen peroxide ($H_2O_2$), $FeCl_3$ (both hydrated and unhydrated), oxone ($2KHSO_5 \cdot KHSO_4 \cdot K_2SO_4$), ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$)), sodium perborate ($NaBO_3$), sodium polyatomic salts (e.g., sodium persulfate ($Na_2S_2O_8$), sodium hypochlorite ($NaClO$)), potassium polyatomic salts (e.g., potassium iodate ($KIO_3$), potassium permanganate ($KMnO_4$), potassium persulfate, potassium persulfate ($K_2S_2O_8$), potassium hypochlorite ($KClO$)), tetramethylammonium polyatomic salts (e.g., tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate ((N$(CH_3)_4)ClO_4$), tetramethylammonium periodate (($N(CH_3)_4)IO_4$), tetramethylammonium persulfate (($N(CH_3)_4)_2S_2O_8$)), tetrabutylammonium polyatomic salts (e.g., tetrabutylammonium peroxomonosulfate), peroxomonosulfuric acid, ferric nitrate ($Fe(NO_3)_3$), amine-N-oxides (e.g., N-methylmorpholine-N-oxide (NMMO); trimethylamine-N-oxide; triethylamine-N-oxide; pyridine-N-oxide; N-ethylmorpholine-N-oxide; N-methylpyrrolidine-N-oxide; N-ethylpyrrolidine-N-oxide) urea hydrogen peroxide (($CO(NH_2)_2$) $H_2O_2$), peracetic acid ($CH_3(CO)OOH$), periodic acid, potassium dichromate, potassium chlorate, 2-nitrophenol, 1,4-benzoquinone, peroxybenzoic acid, peroxyphthalic acid salts, vanadium oxides (e.g., $VO_2$, $V_6O_{13}$), ammonium metavanadate, ammonium tungstate, sodium nitrate, potassium nitrate, ammonium nitrate, strontium nitrate, sulfuric acid, and combinations thereof. Preferably, the oxidizing agent for the amine-free composition comprises hydrogen peroxide, NMMO, urea hydrogen peroxide, and combinations thereof.

When present, solvating agents contemplated include, but are not limited to, 2-pyrrolidinone, 1-(2-hydroxyethyl)-2-pyrrolidinone, glycerol, 1,4-butanediol, tetramethylene sulfone (sulfolane), dimethyl sulfone, ethylene glycol, propylene glycol, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, tetraethylene glycol dimethyl ether, and combinations thereof. Preferably, when present, the solvating agent for the amine-free composition comprises sulfolane (tetramethylene sulfone), 1-(2-hydroxyethyl)-2-pyrrolidinone, and combinations thereof.

When present, reducing agents contemplated include, but are not limited to, ascorbic acid, glycine, gallic acid, potassium disulfite, n-acetyl glycine, potassium tetraborate tetrahydate, glycerin, acetylacetone, sorbitol, sorbate, sorbic acid, and combinations thereof. Reducing agents are added to preferably inhibit cobalt corrosion.

The amine-free compositions described herein are preferably substantially devoid of abrasive material typically used in chemical mechanical polishing processes (before the initiation of cleaning), fluoride-containing sources, amines, quaternary bases, and any combination thereof. Quaternary bases include compounds having the formula $NR^1R^2R^3R^4OH$ and/or $R_1R_2R_3R_4POH$, wherein $R^1$, $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-$C_{10}$ aryl, e.g., benzyl, with the proviso at least one of $R^1$, $R^2$, $R^3$ or $R^4$ has to be a component other than hydrogen.

In a preferred embodiment, the amine-free composition comprises, consists of, or consists essentially of (i) at least one oxidizing agent comprising a species selected from the group consisting of hydrogen peroxide, urea hydrogen peroxide, NMMO, and combinations thereof, (ii) at least one basic compound comprising KOH, (iii) at least one buffering agent comprising a dibasic phosphate salt, (iv) at least one complexing agent comprising a species selected from the group consisting of 5-sulfosalicylic acid and derivatives thereof, CDTA, EDTMP, an amino acid, and combinations thereof, (v) and water, wherein the composition is substantially devoid of amines, quaternary bases, fluoride-containing sources, and abrasive material typically used in chemical mechanical polishing processes, wherein the pH is in a range from about 7 to about 13. In another preferred embodiment, the amine-free composition comprises, consists of, or consists essentially of (i) at least one oxidizing agent comprising a species selected from the group consisting of hydrogen peroxide, urea hydrogen peroxide, NMMO, and combinations thereof, (ii) at least one basic compound comprising KOH, (iii) at least one solvating agent selected from the group consisting of sulfolane, 1-(2-hydroxyethyl)-2-pyrrolidinone, and combinations thereof, (iv) at least one buffering agent comprising a dibasic phosphate salt, (v) at least one complexing agent comprising a species selected from the group consisting of 5-sulfosalicylic acid and derivatives thereof, CDTA, EDTMP, an amino acid, and combinations thereof, (iv) and water, wherein the composition is substantially devoid of amines, quaternary bases, fluoride-containing sources, and abrasive material typically used in chemical mechanical polishing processes, wherein the pH is in a range from about 7 to about 13. In still another embodiment, the amine-free composition comprises, consists of, or consists essentially of (i) at least one basic compound comprising KOH, (ii) at least one solvating agent selected from the group consisting of sulfolane, 1-(2-hydroxyethyl)-2-pyrrolidinone, and combinations thereof, (iii) at least one buffering agent comprising a dibasic phosphate salt, (iv) at least one complexing agent comprising a species selected from the group consisting of 5-sulfosalicylic acid and derivatives thereof, CDTA, EDTMP, an amino acid, and combinations thereof, (v) and water, wherein the composition is substantially devoid of amines, quaternary bases, fluoride-containing sources, and abrasive material typically used in chemical mechanical polishing processes, wherein the pH is in a range from about 7 to about 13. In still another embodiment, the amine-free composition comprises, consists of, or consists essentially of (i) at least one basic compound comprising KOH, (ii) at least one solvating agent selected from the group consisting of sulfolane, 1-(2-hydroxyethyl)-2-pyrrolidinone, and combinations thereof, (iii) at least one buffering agent comprising a dibasic phosphate salt, (iv) at least one complexing agent comprising a species selected from the group consisting of 5-sulfosalicylic acid and derivatives thereof, CDTA, EDTMP, an amino acid, and combinations thereof, (v) at least one reducing agent, (vi) and water, wherein the composition is substantially devoid of amines, quaternary bases, fluoride-containing sources, and abrasive material typically used in chemical mechanical polishing processes, wherein the pH is in a range from about 7 to about 13. Preferably, the amine-free composition has a copper etch rate less than 5 Å min$^{-1}$, a cobalt etch rate less than 5 Å min$^{-1}$, and a BTA removal efficiency greater than 20%, more preferably greater than 30%, and most preferably greater than 40%.

In one embodiment of the first aspect, a concentrated amine-free composition is provided that can be diluted for use as a cleaning solution. A concentrated composition, or "concentrate," advantageously permits a user, e.g. CMP process engineer, to dilute the concentrate to the desired strength and acidity at the point of use. Dilution of the concentrated amine-free composition may be in a range from about 1:1 to about 2500:1, wherein the amine-free composition is diluted at or just before the tool with solvent, e.g., deionized water.

An important feature of the amine-free composition described herein is that the non-aqueous constituents (the constituents other than water) are present in the composition in small quantities, often less than about 20% by weight. This is an economic advantage since an effective amine-free composition can be formulated more economically, which is of importance since post-CMP amine-free compositions are used in large quantities. Furthermore, because the amine-free composition is water-based, the amine-free compositions described herein are more easily disposed of. Notably, the life of the amine-free composition is dependent only on particle loading and as such, the amine-free composition is recyclable.

In yet another preferred embodiment, the amine-free compositions described herein comprise, consist of, or consist essentially of at least one complexing agent, at least one basic compound, at least one buffering agent, water, optionally at least one oxidizing agent, optionally at least one reducing agent, optionally at least one solvating agent, residue and/or contaminants. Importantly, the residue and contaminants may be dissolved and/or suspended in the amine-free composition described herein. Preferably, the residue includes post-CMP residue.

The amine-free compositions described herein are easily formulated by simple addition of the respective ingredients and mixing to homogeneous condition. Furthermore, the amine-free compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the amine-free composition, i.e., more dilute or more concentrated, in the broad practice of the invention, and it will be appreciated that the amine-free compositions can variously and alternatively comprise, consist or consist essentially of any combination of ingredients consistent with the disclosure herein.

Accordingly, another aspect relates to a kit including, in one or more containers, one or more components adapted to form the compositions of the first aspect of the invention. Preferably, the kit includes, in one or more containers, at least one complexing agent, at least one basic compound, at least one buffering agent, water, optionally at least one reducing agent, optionally at least one solvating agent, for combining with additional water, optional oxidizing agent(s), or both, at the fab or the point of use. The containers of the kit must be suitable for storing and shipping said first composition components, for example, NOW-Pak® containers (Advanced Technology Materials, Inc., Danbury, Conn., USA).

In a third aspect, the amine-free composition is usefully employed to clean post-CMP residue and contaminants from the surface of the microelectronic device. Importantly, the amine-free composition does not damage low-k dielectric materials or substantially corrode metal interconnects, e.g., copper, on the device surface. Preferably the amine-free composition removes at least 85% of the residue and contaminants present on the device prior to residue removal, more preferably at least 90%, even more preferably at least 95%, and most preferably at least 99%.

In post-CMP residue and contaminant cleaning application, the amine-free composition may be used with a large variety of conventional cleaning tools such as megasonics and brush scrubbing, including, but not limited to, Verteq single wafer megasonic Goldfinger, OnTrak systems DDS (double-sided scrubbers), SEZ single wafer spray rinse, Applied Materials Mirra-Mesa™/Reflexion™/Reflexion LK™, and Megasonic batch wet bench systems.

In use of the amine-free compositions for cleaning post-CMP residue and contaminants from microelectronic devices having same thereon, the amine-free composition typically is contacted with the device for a time of from about 5 sec to about 10 minutes, preferably about 15 sec to 5 min, at temperature in a range of from about 20° C. to about 50° C. Such contacting times and temperatures are illustrative, and any other suitable time and temperature conditions may be employed that are efficacious to at least partially clean the post-CMP residue/contaminants from the device. "At least partially clean" and "substantial removal" both correspond to at removal of at least 85% of the residue and contaminants present on the device prior to residue removal, more preferably at least 90%, even more preferably at least 95%, and most preferred at least 99%

Following the achievement of the desired cleaning action, the amine-free composition may be readily removed from the device to which it has previously been applied, as may be desired and efficacious in a given end use application of the compositions of the present invention. Preferably, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled amine-free composition. The amine-free composition may be reused until residue and/or contaminant loading reaches the maximum amount the respective composition may accommodate, as readily determined by one skilled in the art.

A still further aspect relates to methods of manufacturing an article comprising a microelectronic device, said method comprising contacting the microelectronic device with an amine-free composition for sufficient time to clean post-CMP residue and contaminants from the microelectronic device having said residue and contaminants thereon, and incorporating said microelectronic device into said article.

EXAMPLE 1

A composition including 20-40 wt % 1,2-hydroxyethyl pyrrolidone, 2-12 wt % HEDP, 0.1-2 wt % dipotassium phosphate, 2-10 wt % KOH to bring to a pH of about 10.5, balance water, and the etch rate of cobalt was determined to be 8.730 Å/min. A new composition having 5-sulfosalicylic acid instead of HEDP (all other ingredients were the same) was prepared and the etch rate of cobalt was reduced to 3.80 Å/min at pH 10.5 and 0.59 at pH 13. It can be concluded that 5-sulfosalicylic acid was a better cobalt corrosion inhibitor than HEDP, and even more effective at higher pH values.

EXAMPLE 2

Compositions were prepared including 20-40 wt % 1,2-hydroxyethyl pyrrolidone, 2-7 wt % 5-sulfosalicylic acid dihydrate, 1-8 wt % dipotassium phosphate, 2-10 wt % KOH, the reducing agent indicated, balance water, and the etch rate of copper and cobalt were determined in Å/min. The results are provided in Table 1.

TABLE 1

Copper and Cobalt etch rates

| Formulation | Reducing agent (wt %) | Copper ER (Å/min) | Cobalt ER (Å/min) |
|---|---|---|---|
| A | none (pH 10.5) | 1.35 | 3.09 |
| B | 3.5 wt % ascorbic acid | 5.27 | 3.47 |
| C | 3 wt % glycine | 24.22 | 16.71 |
| D | 2 wt % gallic acid | 11.66 | 10.33 |
| E | 1.5 wt % potassium sulfite | 1.25 | 2.83 |
| F | 1.5 wt % acetyl glycine | 1.34 | 2.66 |
| G | 0.5 wt % potassium tetraborate tetrahydrate | 1.33 | 2.19 |
| H | 3 wt % sorbitol | 1.20 | 2.20 |

EXAMPLE 3

The pH of formulation A of Example 1 was raised to pH 13 using additional basic compound and the etch rate of cobalt determined. It was found that the etch rate of cobalt decreased to 0.59±0.11 Å/min. In other words, the higher the pH, the lower the cobalt etch rate for that particular solution.

EXAMPLE 4

A removal composition were prepared including 20-40 wt % 1,2-hydroxyethyl pyrrolidone, 2-7 wt % 5-sulfosalicylic acid dihydrate, 1-8 wt % dipotassium phosphate, 2-10 wt % KOH, 1-6 wt % N-acetylglycine, optionally 1-10 wt % arginine, balance water, and the removal of BTA from a PVD copper coupon was determined following immersion of the coupon in the composition for 5 minutes at 25° C. The removal experiment comprised the steps of immersing the PVD Cu coupon in 1% citric acid for 5 minutes, rinsing with DI water for 5 sec, immersion in a 0.1% BTA solution for 5 min, rinsing with DI water for 5 sec, immersing in a 30:1 dilution of the removal composition (with and without the arginine) for 5 min, rinsing with DI water for 5 sec, and a nitrogen drying step. The BTA peak pre- and post-clean was determined using FTIR. It was determined that the removal efficiency of the composition without the arginine was about 6% while the removal efficiency of the composition with the arginine was about greater than 15%.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition for cleaning residue and contaminants from a surface of a microelectronic device having said residue and contaminants thereon, said composition comprising from about 1 wt% to about 30 wt% of at least one complexing agent, from about 0.01 wt% to about 5 wt% of at least one basic compound, from about 0.01 wt% to about 10 wt% of at least one buffering agent, from about 42 wt% to about 99 wt% water, from about 0.01 wt% to about 10 wt% of at least one reducing agent, optionally from about 0.01 wt% to about 10 wt% of at least one oxidizing agent, and optionally from about 0.01 wt% to about 30 wt% of at least one solvating agent,
   wherein the at least one reducing agent comprises a species selected from the group consisting of ascorbic acid, potassium disulfite, n-acetyl glycine, potassium tetraborate tetrahydrate, acetylacetone, and combinations thereof,
   wherein the at least one buffering agent comprises a species selected from the group consisting of dipotassium phosphate, dibasic phosphate, tribasic phosphate, mixtures of dibasic and tribasic phosphates, mixtures of dibasic and tribasic carbonates, and combinations thereof,
   wherein the composition has a pH in a range of from 7 to about 13 and
   wherein the composition is a post-CMP cleaning composition that removes post-CMP residue and contaminants from a microelectronic device having the residue and contaminants thereon and is free of fluoride-containing sources and abrasive material used in chemical mechanical polishing processes and substantially devoid of amines and quaternary bases.

2. The composition of claim 1, wherein the pH is in a range from 10.5 to about 13.

3. The composition of claim 1, wherein the at least one basic compound comprise a species selected from the group consisting of KOH, CsOH, ammonium hydroxide, and combinations thereof.

4. The composition of claim 1, wherein the at least one basic compound comprises KOH.

5. The composition of claim 1, wherein the at least one complexing agent comprises a species selected from the group consisting of lactic acid, maleic acid, ascorbic acid, malic acid, citric acid, benzoic acid, fumaric acid, succinic acid, oxalic acid, malonic acid, mandelic acid, maleic anhydride, phthalic acid, aspartic acid, glutamic acid, glutaric acid, glycolic acid, glyoxylic acid, glycerin, acetylacetone, salicylhydroxamic acid, a salt thereof, or a partially neutralized form thereof, phenylacetic acid, quinic acid, pyromellitic acid, tartaric acid, terephthalic acid, trimellitic acid, trimesic acid, gluconic acid, glyceric acid, formic acid, acetic acid, propionic acid, acrylic acid, adipic acid, itaconic acid, glucuronic acid, glycine, lysine, β-alanine, histidine, phenylalanine, cysteine, leucine, serine, arginine, threonine, asparagine, glutamine, selenocysteine, proline, valine, isoleucine, methionine, tyrosine, tryptophane, 8-hydroxyquinoline, 2,4-pentanedione, benzetetracarboxylic acid, pyruvic acid, tannic acid, sulfanilic acid, 2-hydroxyphosphonocarboxylic acid (HPAA), pyrocatecol, pyrogallol, gallic acid, ethylenediamine tetraacetic acid (EDTA), diethylenetriaminepentaacetic acid (DTPA), (1,2-cyclohexylenedinitrilo)tetraacetic acid (CDTA), iminidiacetic acid, 2-phosphonobutane-1,2,4-tricarboxylic acid (PBTCA), phosphonic acid, hydroxyethylidene diphosphonic acid (HEDP), 1-hydroxyethane-1,1-diphosphonic acid, nitrilo-tris(methylenephosphonic acid, ethylenediamine tetra(methylene phosphonic acid (EDTMP), salicylic acid, p-toluenesulfonic acid, 5-sulfosalicylic acid and derivatives thereof, and any combination thereof.

6. The composition of claim 1, wherein the at least one complexing agent comprises a phosphonic acid derivative, 5-sulfosalicylic acid or derivatives thereof, an amino acid, and any combination thereof.

7. The composition of claim 1, wherein the at least one buffering agent comprises a species selected from the group consisting of dibasic phosphate, tribasic phosphate, mixtures of dibasic and tribasic phosphate, and combinations thereof.

8. The composition of claim 1, comprising the at least one oxidizing agent, wherein the at least one oxidizing agent comprises a species selected from the group consisting of ozone, nitric acid, bubbled air, cyclohexylaminosulfonic acid, hydrogen peroxide, $FeCl_3$, oxone ($2KHSO_5 \cdot KHSO_4 \cdot K_2SO_4$), ammonium peroxomonosulfate, ammonium chlorite, ammonium chlorate, ammonium iodate, ammonium perborate, ammonium perchlorate, ammonium periodate, ammonium persulfate, ammonium hypochlorite, sodium perborate, sodium persulfate, sodium hypochlorite, potassium iodate, potassium permanganate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, N-methylmorpholine-N-oxide, trimethylamine-N-oxide, triethylamine-N-oxide, pyridine-N-oxide, N-ethylmorpholine-N-oxide, N-methylpyrrolidine-N-oxide, N-ethylpyrrolidine-N-oxide, urea hydrogen peroxide, peracetic acid, periodic acid, potassium dichromate, potassium chlorate, 2-nitrophenol, 1,4-benzoquinone, peroxybenzoic acid, peroxyphthalic acid salts, vanadium oxides, ammonium metavanadate, ammonium tungstate, sodium nitrate, potassium nitrate, ammonium nitrate, strontium nitrate, sulfuric acid, and combinations thereof.

9. The composition of claim 8, wherein the at least one oxidizing agent comprises a species selected from the group consisting of hydrogen peroxide, NMMO, urea hydrogen peroxide, and combinations thereof.

10. The composition of claim 1, further comprising at least one solvating agent comprising a species selected from the group consisting of 2-pyrrolidinone, 1-(2-hydroxyethyl)-2-pyrrolidinone, glycerol, 1,4-butanediol, tetramethylene sulfone (sulfolane), dimethyl sulfone, ethylene glycol, propylene glycol, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof.

11. The composition of claim 1, further comprising at least one solvating agent comprising sulfolane, 1-(2-hydroxyethyl)-2-pyrrolidinone, and combinations thereof.

12. The composition of claim 1, wherein the composition comprises urea hydrogen peroxide, KOH, $K_2HPO_4$, 5-sulfosalicylic acid, and water, and the pH is in a range from about 7 to about 13.

13. The composition of claim 1, wherein the residue and contaminants comprise post-CMP residue and contaminants selected from the group consisting of particles from a CMP polishing slurry, chemicals present in a CMP polishing slurry, reaction by-products of a CMP polishing slurry, carbon-rich particles, polishing pad particles, copper, and copper oxides.

14. The composition of claim 1, further comprising post-CMP residue and contaminants.

15. A method of cleaning residue and contaminants from a microelectronic device having said residue and contaminants thereon, said method comprising contacting the microelectronic device with the composition of claim 1 for sufficient time to at least partially clean said residue and contaminants from the microelectronic device.

16. The method of claim 15, wherein said residue and contaminants comprise post-CMP residue and contaminants.

17. The method of claim 15, wherein said contacting comprises a condition selected from the group consisting of: having the composition contact the microelectronic device for a contact time of from about 15 seconds to about 5 minutes; having the temperature of the composition be in a range of from about 20° C. to about 50° C.; and combinations thereof.

* * * * *